US005905399A

United States Patent [19]

Bosnyak et al.

[11] Patent Number: 5,905,399

[45] Date of Patent: May 18, 1999

[54] CMOS INTEGRATED CIRCUIT REGULATOR FOR REDUCING POWER SUPPLY NOISE

[75] Inventors: Robert J. Bosnyak, San Jose; Robert J. Drost, Palo Alto, both of Calif.

[73] Assignee: Sun Microsystems, Inc., Palo Alto, Calif.

[21] Appl. No.: 08/885,598

[22] Filed: Jun. 30, 1997

[51] Int. Cl.[6] ..................... H03K 17/16

[52] U.S. Cl. ..................... 327/384; 327/389; 327/379

[58] Field of Search ..................... 327/535, 379, 327/380, 381, 384, 389, 390, 391, 310; 326/26, 27

[56] References Cited

U.S. PATENT DOCUMENTS 4,947,063 8/1990 O'Shaughnessy et al. ............. 307/572
5,216,291 6/1993 Seevinck et al. ..................... 307/296.6
5,781,045 6/1998 Walia et al. ............................ 327/108

OTHER PUBLICATIONS

Timothy J. Schmerbeck, "Mechanisms and Effects of Noise Coupling in Mixed–Signal ICs," 1996.

*Primary Examiner*—Toan Tran
*Assistant Examiner*—Hai L. Nguyen
*Attorney, Agent, or Firm*—Finnegan, Henderson, Farabow, Garrett & Dunner, L.L.P.

[57] ABSTRACT

A CMOS integrated circuit regulator for mixed mode integrated circuits reduces digital switching noise through use of a clamped dual source follower circuit and a charge reservoir bypass capacitor. Relatively constant current is provided to the CMOS logic during transitions to minimize switching noise.

23 Claims, 2 Drawing Sheets

10

200

$P_T$
$P_B$
230
208
204
206
$V_{DD}$
GND
214
218
216
$V_{com}$
226
228
202
224
212
234
222

CM OS INTEGRATED CIRCUIT REGULATOR FOR REDUCING POWER SUPPLY NOISE

BACKGROUND OF THE INVENTION

The present invention relates to a complementary metal-oxide-semiconductor (CMOS) voltage regulator circuit for reducing digital signal noise in mixed mode integrated circuits. CMOS integrated circuits are currently used in many digital logic applications. These circuits are relatively fast and consume little power during the static or non-switching state.

FIG. 1 illustrates a circuit schematic of a basic CMOS inverter 10, the fundamental component of most CMOS logic circuits. Inverter 10 has an input node 12, an output node 14, a p-channel transistor 16, and an n-channel transistor 18. The transistors are connected to $V_{DD}$ (power) and GND (ground) as shown, and their gates are tied together as shown. In operation, application of a low potential at input node 12 causes n-channel transistor 18 to turn off and renders p-channel transistor 16 conductive, thereby coupling output 14 to $V_{DD}$. Application of a high potential to input node 12 turns off p-channel transistor 16 and turns on n-channel 18, coupling output 14 to $V_{SS}$.

When a CMOS device, such as inverter 10, is in a steady-state condition (not switching between output states), there is no current flow in the inverter from the power supply. If the inverter output switches from low to high, two components of current are drawn from $V_{DD}$—an overlap current and a displacement current. The overlap current, which exists during the brief moment when both transistors are conducting, flows through both the pmos and nmos transistors to ground. The displacement current (i.e., $C_l$*$dV_{out}$/dt) flows through the pmos transistor only to charge the load capacitance ($C_l$). At high switching frequencies, the displacement current is large. As it flows through parasitic resistances and inductances associated with the digital power grid, bonding pads and wires, package pins, etc., resulting in digital switching noise. If the digital $V_{SS}$ power supply line is connected to the substrate (common practice in p-well CMOS technology), the power supply switching noise due to current surges from charging and discharging of the loads at the gates is coupled directly into the n-substrate, which is shared by analog circuitry. The digital switching noise can be problematic to the operation of the analog circuitry, which can be fairly sensitive. In addition to CMOS static logic, other logic families such as dynamic logic, exhibit similar noise generation problems.

Prior attempts at a solution to the problem—including power supply filters, wide spacings and diffused guardbands between the analog and digital subsection, separate analog and digital supply lines, separate bonding pads and wires, as well as separate package pins—have proven unacceptable. These attempts resulted only in a reduction in the transmission of noise from on-chip static logic gates through the substrate to the analog circuitry, at the expense of valuable silicon area and, in some cases, increased circuit complexity.

While the use of other logic families, such as folded source-coupled logic (FSCL) and current-steering logic (CSL), have certain advantages, use of these technologies requires circuit redesign. Further, the advantages associated with the use of other logic families, such as FSCL and CSL, do not outweigh the disadvantage of having to redesign CMOS circuitry.

It is therefore desirable to minimize/eliminate the generation of digital switching noise produced by CMOS logic circuits in mixed mode integrated circuits. It is also desirable to retain common CMOS circuit topologies to simplify useage in mixed-mode integrated circuits.

SUMMARY OF THE INVENTION

This invention meets those needs through a CMOS integrated circuit regulator which provides a constant current to a set of logic gates during transitions of those gates.

The advantages accruing to the present invention are numerous. For example, the external supply shared by analog circuits is decoupled. Current to the supply rails is kept nearly constant by the clamping action of clamping transistors, thereby reducing di/dt magnitudes. Excess charge for transient currents is supplied by a capacitor, which is replenished during non-switching times. Excursions of the output are limited and well-regulated to match subsequent logic gate input trigger thresholds. Simple existing CMOS logic functions can easily be implemented on the regulated supply rails without redesign of the logic topology.

A CMOS integrated circuit regulator consistent with the present invention comprises a supply rail for supplying power to a CMOS gate having at least one logic state, a current source coupled to the supply rail, charge means coupled to the supply rail, the charge means supplying current to the CMOS gate during a transition in the logic state of the gate, and means, coupled to the supply rail, for clamping the voltage level of the rail, current from the source being diverted from the means for clamping to the CMOS gate during a transition in the logic state of the gate so as to minimize generation of the noise resulting from the transition in the logic state of the CMOS gate.

The above desires and other desires, features, and advantages of the present invention will be readily appreciated by one of ordinary skill in the art from the following detailed description of the preferred embodiments when taken in connection with the accompanying drawings.

DETAILED DESCRIPTION OF THE PREFERRED EMBODIMENTS

Figure 1:
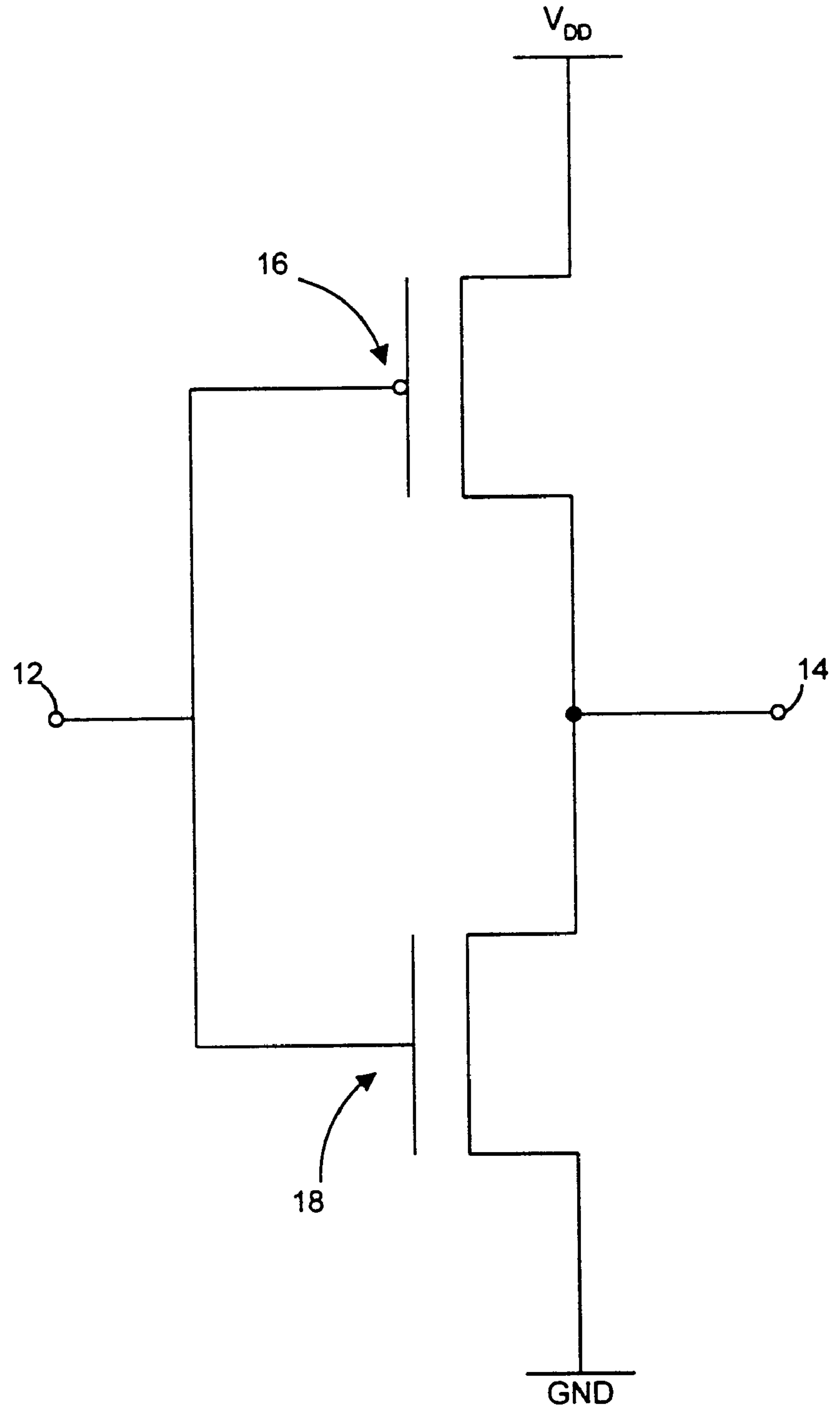
FIG. 1 Prior Art
FIG. 1 is a schematic diagram of a conventional CMOS inverter.
Figure 2:
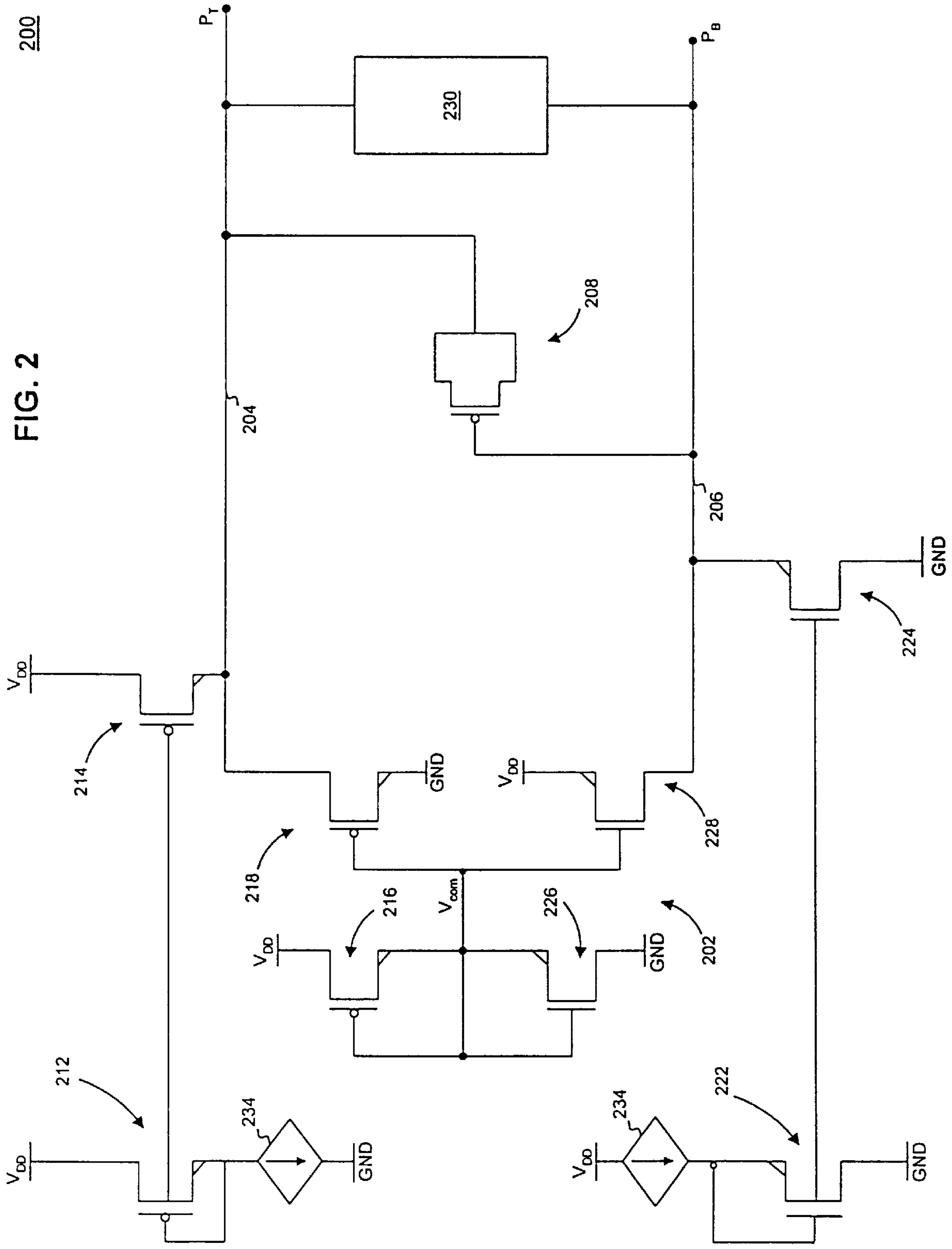
FIG. 2 is a schematic diagram of a CMOS integrated circuit regulator consistent with the present invention.

FIG. 2 depicts a CMOS integrated circuit regulator 200 for minimizing digital switching noise consistent with the present invention. Regulator 200 uses a clamped dual source follower circuit 202 connected to internal power supply rails 204 and 206, and a charge reservoir bypass capacitor 208 disposed within an integrated circuit. The regulator includes a plurality of pmos transistors 212, 214, 216, and 218, and a plurality of nmos transistors 222, 224, 226, and 228, electrically interconnected as shown. Positive supply ($P_T$) and negative supply ($P_B$) are internal to the integrated circuit, and the supply rails are regulated by the current source functions performed by pmos transistor 214 and nmos transistor 224. Rails 204 and 206 are also clamped by transistors 218 and 228 during times of non-switching activity.

Charge reservoir bypass capacitor 208, which is placed across rails 204 and 206, can be fabricated on chip by several ordinary means, although it is depicted in FIG. 2 as a pmos transistor. Other capacitor structures, such as metal-to-metal, poly-to-metal, or poly-to-poly, may also be used. This capacitor serves as a reservoir of charge to make up most of the transient charge that contributes to the digital switching noise. Node $V_{COM}$, a voltage clamp that serves transistors 218 and 228, limits the excursion of the output levels of CMOS logic 230 supplied by this regulator. This is accomplished by the source following mode of transistors 218 and 228.

Transistors 212 and 214 are configured as a current mirror. The gate and drain of transistor 212 are tied together in a diode connection as shown. When current passes through the transistor 212, a gate-source voltage (the value of which is a function of the square root of the current) is created. If the gate of transistor 212 is tied to the gate of an identical transistor (i.e., transistor 214), an identical current is created in transistor 214. The current passing through transistors 212 and 222 of the current mirrors is shown as current sources 234 and 236, respectively. These current sources could take any one of several forms, such as a long channel nmos transistor, a band gap regulator, or even a resistor. As is known, different current ratios can be established by varying certain parameters. For example, if the physical width of the channel in transistor 214 is twice the width of the channel in 212, then twice as much current is set up in transistor 214. Use of this current mirror allows for production of a relatively constant current supplied to transistor 218 and bypass capacitor 208. Transistors 222 and 224 function in a similar manner as transistors 212 and 214. The relatively constant current generated in transistor 224 is provided to ground. This relatively constant current is maintained by operating transistor 214 and transistor 224 in the saturated mode. Furthermore, transistor channel length can be increased to mitigate channel length modulation with changing $V_{DS}$.

Clamped dual source follower 202 includes transistors 216 and 226 electrically interconnected as a voltage divider. The gates of transistors 216 and 226 are tied together, as are the drains, which in turn are connected to the gates of transistors 218 and 228 to form node $V_{COM}$, as shown in FIG. 2. The sources of transistors 218 and 228 are connected to rails 204 and 206, respectively. As shown, the charge bypass capacitor 208 is also connected across the rails, with the drain and source being tied together and connected to rail 204, and the gate being tied to rail 206. It is preferable to have different sources of $V_{DD}$ as well as different sources of ground connections. Connection of a particular transistor to a particular source of $V_{DD}$ or ground depends on the nature of the transistor. More particularly, because transistors 218 and 228 switch, they are connected to different sources of $V_{DD}$ and ground than transistors 214 and 224.

The absolute voltage present at node $V_{COM}$ is selected to be at the trigger level of a typical CMOS logic. This trigger level is approximately the center of the supply. Positive supply $P_T$, therefore, is clamped at a value $V_{COM}+V_{TP}$ and negative supply $P_B$ is clamped, through the source follower arrangement, at a value $V_{COM}-V_{TN}$. $V_{TP}$ and $V_{TN}$ are the threshold voltages associated with pmos transistor 218 and nmos transistor 228, respectively, which are typically 0.7–0.8 volts.

With this arrangement, the supplies are regulated to be a known current level independent of any external power supply—the $P_T$ and $P_B$ supplies remain relatively constant despite external supply fluctuations. Further, since the supply has been lowered, the capacitor is charging to a lower level and discharging to a higher level when charging and discharging the load (i.e., CMOS logic 230). Simultaneously, however, the capacitor does not have as far to go to reach the threshold levels above and below the trigger point. While this arrangement (maintenance of the supply rails at a threshold above and below the trigger level) may slow performance of CMOS logic 230, overall operation is more consistent. The value at which $V_{COM}$ is maintained may be varied and set depending on the type of logic functions comprising CMOS 230 placed across $P_T$ and $P_B$. For example, for domino logic, $V_{COM}$ could be reduced and set at a value nearer a threshold reflecting the trigger level for that type of logic. Secondary device effects, such as body effect (the characteristic shift in threshold voltage resulting from bias applied to a substrate), may come into play and advantageously raise the threshold, resulting in a wider noise margin.

Operation of the regulator shown in FIG. 2 will now be discussed. For purposes of simplicity, CMOS 230 may be considered to be a single CMOS inverter. When CMOS 230 is in a quiescent state (i.e., no switching is occurring), current from transistor 214 supplied to rail 204 flows through transistor 218 to ground. The gate and source voltage of transistor 228 permits current to flow from the source of that transistor to rail 206 and through transistor 224 to ground. Thus, transistor 224 functions as a current sink. During periods of switching inactivity, charge reservoir bypass capacitor 208 is charged based on the potential difference between rails 204 and 206.

If the output of CMOS 230 (i.e., an inverter) transitions from low to high, the pmos transistor of the inverter turns on. A displacement current flows out of CMOS 230 into the load driven by the inverter. Nmos inverter transistor is momentarily conducting at the same time pmos inverter transistor is conducting. While both transistors are conducting, a short circuit between $P_T$ and $P_B$ exists, resulting in the creation of a transient overlap current. The rail 204 voltage drops slightly due to the displacement current and the overlap current. As a result, current supplied by transistor 214 is diverted from transistor 218 to the pmos inverter transistor, which then supplies current to the load of the inverter.

Though transient, the magnitude of this overlap current might exceed the magnitude of current diverted from transistor 218. The current shortfall is made up by current from the capacitor 208 as the voltage on rail 204 drops slightly. The overlap current flows from rail 206 through transistor 224 to ground. While the overlap current is momentarily flowing, the current from transistor 228 diminishes, since transistor 224 seeks to keep the current setup by transistor 222 into ground constant.

The amount of current drawn from capacitor 208 is a function of the frequency of the transitions in the output of the inverter, since the capacitor needs a certain amount of time between transitions to charge. Preferably, the parameters of the capacitor are selected so that it can be fully charged between transitions. As the output of the inverter begins to approach $P_T$, the nmos transistor turns off, and the overlap current disappears. Thereafter, the pmos transistor supplies the current needed to charge the capacitive load connected to the inverter. Current from transistor 214 then gets redirected back to ground through transistor 218. This arrangement results in attempt to make the current load on $V_{DD}$ constant, thereby minimizing the problematic digital switching noise.

When the output of CMOS 230 transitions from high to low, nmos inverter transistor turns on when the input to the nmos inverter transistor begins to exceed $V_{COM}$. The nmos inverter transistor begins to absorb current off the load, forcing current to the rail 206 and then to ground through transistor 224. This current flow has the effect of diminishing current from transistor 228, since transistor 224 seeks to keep the current setup by transistor 222 into ground constant. The overlap current begins to alter the relative voltages of the rails (i.e., rail 206 voltage increases slightly and rail 204 voltage decreases slightly). As $P_T$ starts to drop, the input to the inverter has not yet reached $V_{COM}$, and current from transistor 214 is diverted away from transistor 218 to the inverter. This current, however, may be insufficient to meet the overlap current, and the capacitor makes up this current shortfall. Once the transition from high to low is complete, the nmos transistor is fully on and the pmos transistor is off (i.e., the output of the inverter has reached $P_B$, and the input has reached $P_T$). At that point, the current needed by transistor 224 is made up by current from transistor 228, and $P_B$ is once again clamped at the appropriate voltage.

While the above discussion of the operation of the regulator was limited to a single CMOS inverter, CMOS 230 in FIG. 2 can also represent a plurality of CMOS gates or a compilation of logic functions such as inverters, AND gates, NAND gates, OR gates, and NOR gates, to name a few. Each of these gates can transition at different times and at different frequencies. Thus, at any given time, some may be in a quiescent state, while some are switching from low to high, and others from high to low. Further, the schematic shown in FIG. 2 may be duplicated many times on a single integrated circuit chip. In this scenario, the present invention contemplates each differing CMOS 230 having a regulator 200 with components (e.g., transistors, capacitors, etc.) designed specifically for that particular arrangement of logic functions.

Simple rules for the design of the regulator to handle the different scenarios may be developed. The physical size of transistors and the size of capacitor 208 are a function of transition frequency, and the of gates (i.e., logic complexity) and can be tailored to minimize switching noise. For example, as the frequency of transitions increases, so does the average current drawn by CMOS 230, resulting in a need for larger transistors. A larger sized capacitor is better able to make up for the current shortfall resulting from the overlap current during transitions. However, increased component size comes at the expense of valuable silicon space, so trade-offs are required. Table 1 below summarizes typical parameters of components shown in FIG. 2 and discussed above.

TABLE 1

| | | |
|---|---|---|
| Current in sources 234 and 236 | 1 | mA |
| Width of capacitor 208 | 20 | microns |
| Length of capacitor 208 | 2.0 | microns |
| Width of transistors 218 and 228 | 12 | microns |
| Width of transistor 216 | 2.6 | microns |
| Width of transistor 226 | 3.0 | microns |

It will be apparent to those skilled in this art that various modifications and variations can be made to the CMOS integrated circuit regulator for reducing power supply noise disclosed herein consistent with the present invention without departing from the spirit and scope of the invention. Other embodiments will be apparent to those skilled in this art from consideration of the specification and practice of the strategy disclosed herein. The specification and examples be considered exemplary only, with a true scope and spirit of the invention being indicated by the following claims.

We claim:

1. A CMOS integrated circuit regulator for reducing noise in a mixed-mode circuit, the regulator comprising:

a supply rail for supplying current to a CMOS gate in the circuit having at least one logic state;

a current source coupled to the supply rail;

charge means coupled to the supply rail; and a source follower circuit coupled to the supply rail to ensure that current is provided to the CMOS gate from the charge means during a transition in the logic state.

2. The regulator of claim 1 wherein the source follower circuit is connected to sink current from the current source when the CMOS gate is in a quiescent state.

3. The regulator of claim 1 wherein the source follower circuit is connected to divert current from the the current source to the CMOS gate during a transition in the logic state.

4. The regulator of claim 1 wherein the charge means is connected to provide current to the CMOS gate during a transition in the logic state.

5. The regulator of claim 1 wherein the source follower circuit includes a pair of transistors the gates of which are tied together to form a node biased to a trigger point.

6. The regulator of claim 5 further comprising a biasing circuit for biasing the node to the trigger point.

7. The regulator of claim 6 wherein the biasing circuit includes an inverter having an input and an output tied to the node.

8. The regulator of claim 1 wherein the current source coupled to the supply rail includes a pair of transistors configured as a current mirror.

9. The regulator of claim 1 wherein the charge means is a transistor the source and drain of which are tied together.

10. The regulator of claim 1 wherein the source follower circuit and the current source are connected to provide a relatively constant current to the CMOS gate during a transition in the logic state to compensate for currents created in the CMOS gate as a result of the transition.

11. A CMOS integrated circuit regulator for reducing noise in a mixed-mode circuit including CMOS logic, the CMOS logic including at least one gate having at least one logic state, the regulator comprising:

a pair of power supply rails coupled to the CMOS logic;

a source follower circuit coupled to the supply rails;

a current source coupled to each supply rail;

charge means coupled to the supply rails and electrically connected in parallel with the CMOS logic, to ensure that current is provided to CMOS logic during a transition in the logic state.

12. The regulator of claim 11 wherein the source follower circuit is connected to sink current from at least one of the current sources when the CMOS logic is in a quiescent state.

13. The regulator of claim 11 wherein the source follower circuit is connected to divert current from the current sources to the CMOS logic during a transition in the logic state.

14. The regulator of claim 11 wherein the charge means is connected to provide current to the CMOS logic during a transition in the logic state.

15. The regulator of claim 11 wherein the source follower circuit includes a pair of transistors the gates of which are tied together to form a node biased to a trigger point.

16. The regulator of claim 15 further comprising a biasing circuit for biasing the node to the trigger point.

17. The regulator of claim 16 wherein the biasing circuit includes an inverter having an input and an output tied to the node.

18. The regulator of claim 11 wherein the current sources coupled to the supply rails each include a pair of transistors configured as a current mirror.

19. The regulator of claim 11 wherein the charge means is a transistor the source and drain of which are tied together.

20. The regulator of claim 11 wherein the source follower circuit and at least one of the current sources are connected to provide a relatively constant current to the CMOS logic during a transition in the logic state to compensate for currents created in the CMOS logic as a result of the transition.

21. A method, for use with a CMOS integrated circuit regulator, for reducing noise in a mixed-mode circuit including CMOS logic, the CMOS logic including at least one gate having at least one logic state, the method comprising:

coupling a pair of power supply rails to the CMOS logic and coupling a current source to at least one of the power supply rails;

clamping the level of the power supply rails when the CMOS logic is in a quiescent state;

charging a capacitor coupled to the supply rails electrically in parallel with the CMOS logic when the CMOS logic is in a quiescent state; and supplying current to the CMOS logic from at least one of the current source and the capacitor during a transition in the logic state to minimize generation of noise resulting from the transition.

22. The method of claim 21 wherein the step of clamping the level of the power supply rails includes the substep of coupling a source follower circuit to the power supply rails.

23. The method of claim 22 wherein the step of supplying current to the CMOS logic includes the substep of diverting current from the current source to the CMOS logic during the transition.

* * * * *